(12) United States Patent
Södö

(10) Patent No.: US 7,902,956 B2
(45) Date of Patent: Mar. 8, 2011

(54) FILTERING CHOKE ARRANGEMENT

(75) Inventor: Nicklas Södö, Vaasa (FI)

(73) Assignee: Vacon Oyj, Vassa (FI)

( * ) Notice: Subject to any disclaimer, the term of this patent is extended or adjusted under 35 U.S.C. 154(b) by 136 days.

(21) Appl. No.: 12/327,545

(22) Filed: Dec. 3, 2008

(65) Prior Publication Data

US 2009/0140829 A1 Jun. 4, 2009

(30) Foreign Application Priority Data

Dec. 4, 2007 (FI) .................................... 20075873

(51) Int. Cl.
*H01F 27/28* (2006.01)

(52) U.S. Cl. ....................................................... 336/229

(58) Field of Classification Search .............. 336/5, 170, 336/180–184, 212–215, 229
See application file for complete search history.

(56) References Cited

U.S. PATENT DOCUMENTS

| | | | |
|---|---|---|---|
| 6,909,352 B2 * | 6/2005 | Hobson et al. ................. | 336/178 |
| 2005/0030140 A1 * | 2/2005 | Dahlgren et al. ................ | 336/5 |
| 2006/0186981 A1 | 8/2006 | Jang et al. | |

FOREIGN PATENT DOCUMENTS

| | | |
|---|---|---|
| EP | 1 487 092 A1 | 12/2004 |
| JP | 7-22886 A | 1/1995 |
| JP | 07022886 A * | 1/1995 |
| JP | 8-138947 A | 5/1996 |

* cited by examiner

*Primary Examiner* — Tuyen Nguyen
(74) *Attorney, Agent, or Firm* — Birch, Stewart, Kolasch & Birch, LLP

(57) ABSTRACT

A polyphase filtering choke arrangement of a power electronics appliance, more particularly of a frequency converter, which arrangement comprises two separate magnetic cores, around both of which a polyphase winding is arranged, particularly for filtering the harmonics of a network current and the common-mode noise currents, wherein both the magnetic cores (1, 2, 101a-101c, 102a-102c, 130a-130d, 140a-140d) are shaped to form a closed magnetic circuit, the magnetic cores (1 and 2, 101a-101c and 102a-102c, 130a-130d and 140a-140d) are arranged one on top of the other, the magnetic cores are connected to each other with connecting pieces (11-13, 11a-13b, 111-113, 121-124), and the winding directions of the windings of the magnetic cores are opposing with respect to each other, in which case the fluxes produced in the magnetic cores of each current are of opposing directions, in which case the flux produced by the difference-mode current circulates via the connecting pieces from one magnetic core to another.

20 Claims, 4 Drawing Sheets

FILTERING CHOKE ARRANGEMENT

FIELD OF TECHNOLOGY

The object of this invention is a filtering choke arrangement of a power electronics appliance, more particularly of PWM frequency converter provided with an active network bridge. The choke arrangement is suited to filtering the harmonics of a three-phase network current and the common-mode noise currents, but it can be used also to limit the harmonics of a three-phase output current.

PRIOR ART

The use of an active network bridge in frequency converters, in which network bridge semiconductor switches are used, is known to be necessary when it is desired to lead the braking energy of the motor connected to the frequency converter back to the supply network. It is also known that the waveform of the network current produced by an active network bridge is almost sinusoidal. That being the case the harmonics content of it is low which is also a good reason to use an active network bridge e.g. in the kinds of cases in which the network current of the electrical drive must meet the requirements of industry standards, such as IEC/EN 61000-3-12.

In a PWM frequency converter the active network bridge normally comprises the same type of active bridge circuit (AFE, FIG. 2) implemented with active semiconductor switches as the inverter (INU, FIG. 1) that supplies the motor. The network bridge can be common to numerous inverters in so-called common DC busbar systems.

It is prior art to connect a filtering unit comprising passive components between the AFE unit and the supply network to limit the harmonics of the network current and also to achieve the desired phase shift between the network voltage and the network current. At its simplest a filter is simply a three-phase choke, but to limit the switching frequency voltage distortion of the supply current it is normally necessary to use a more complete filter solution, e.g. an LFU unit according to FIG. 2, which comprises two three-phase chokes between which phase-specific capacitors are connected. The capacitors and the choke $L_2$ function here as a filter of the switching frequency current produced by the AFE unit, the purpose of which is to reduce distortion of the voltage in the connection point ($U_{L1}$, $U_{L2}$, $U_{L3}$) of the supply network.

Figure 3:
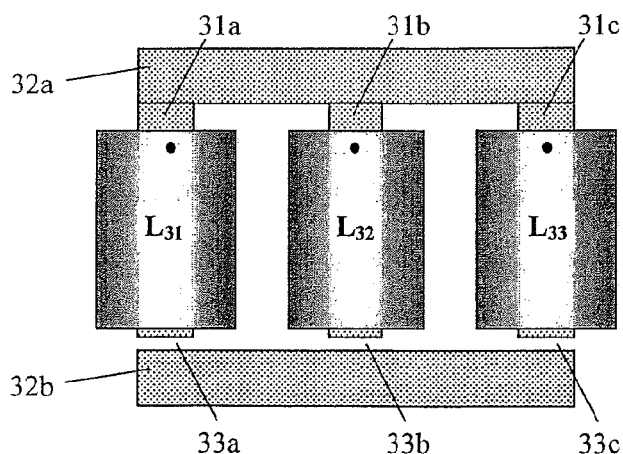

According to prior art separate three-phase chokes, e.g. $L_1$, $L_2$ according to FIG. 3, are used in the LFU unit. A drawback of the solution is the large space needs and cost needed for two separate chokes. Using phase-specific chokes is also possible, but in this case the space needs and cost are even greater.

One weakness of the choke solution according to FIG. 3 is also that its ability to attenuate common-mode currents is weak. Common-mode currents, i.e. currents that travel in a synchronous phase in all phases, cause most of the switching phenomena of the fast power semiconductor switches of the AFE and the INU, and they are known to be the main cause of the high-frequency interference caused in the environment of the device. The interference caused by conducting along cables to the supply network can be attenuated effectively as is known with a so-called common-mode choke, which forms a high impedance to currents of the same phase but a very small impedance to difference-mode currents. As a result of this, it is possible when high-frequency interference must be attenuated that another filtering choke, e.g. according to FIG. 5, must be added to the input connection of the device in addition to the other chokes.

SUMMARY OF THE INVENTION

The object of this invention is a filtering choke arrangement of a power electronics appliance, more particularly of frequency converter provided with an active network bridge, with which the drawbacks of prior art are avoided. The filtering choke arrangement according to the invention comprises two separate three-phase windings connected in series, to the connection point between which it is possible to connect phase-specific capacitors. The choke has at the same time, apart from an impedance that attenuates the difference-mode harmonics of the network current, also a substantial impedance that attenuates the common-mode currents. With the choke according to the invention it is also possible to set the magnitudes of the difference-mode impedances and common-mode impedances independently with respect to the other.

In the solution according to the invention two three-phase windings of the choke are arranged around two separate magnetic cores one on top of the other, i.e. arranged on planes in the same direction, which cores are both shaped to form a closed magnetic circuit, and which cores are connected to each other with a third connecting piece that conducts magnetic flux well to achieve a unified magnetic circuit. The directions of the windings are such that the fluxes produced in the magnetic cores of each phase current are of opposing directions, in which case the flux produced by the difference-mode current circulates via the connecting pieces from one magnetic core to another. With the selections of the magnetic materials of the cores and of the connecting pieces (which can be different), with the number of turns of the windings and with possible air gaps e.g. around the connecting pieces, it is possible to set the inductance that limits the harmonics of the difference-mode current. The fluxes produced by the common-mode current instead circulate purely in the magnetic core without passing via the connecting pieces from one core to another. That being the case the magnitude of the inductance limiting the common-mode current can be influenced with the material sections of the magnetic cores, with the number of turns of the windings and with possible air gaps of the magnetic cores.

According to one preferred embodiment of the invention the connecting pieces are divided into two parts, between which is added a third magnetic core arranged on a plane in the same direction as the other cores, which is also shaped to form a closed magnetic circuit. A winding is not arranged around this additional core. This kind of choke solution enables, when the difference-mode currents of the chokes $L_1$ and $L_2$ (FIG. 2) are of different magnitudes, the flux component produced by this current difference to travel via the extra core in question. Difference-mode currents are of different magnitudes e.g. when phase-specific capacitors are connected to the connection point between the windings, in which case the switching frequency current passing via the choke $L_1$ is substantially smaller than the corresponding current component passing via the choke $L_2$.

According to another preferred embodiment of the invention the choke comprises four windings. This kind of choke is particularly suited for use when the frequency converter/inverter unit comprises a supply network provided with a neutral wire (so-called isolated operation), the loading of which can be asymmetrical. In this kind of case current that is filtered with the same method as the phase currents flows via the neutral wire.

It is also possible to use e.g. core compositions manufactured from powder materials or ferrite materials, which are very well suited to attenuating high-frequency common-mode currents, in the choke. In certain choke geometries it is possible to use die cut core parts that are stacked one on top of the other.

When the core parts comprise different pieces that are connected to each other, the windings of the choke can be wound around separate coil formers, which are then installed into position around the core parts as prefabricated windings. When the cores are circular in shape the windings can be manufactured from e.g. toroidal transformers and toroidal chokes with technology that has become prior art. A special advantage in terms of manufacturing technique can be achieved when both the subassemblies comprising the wound magnetic cores are exactly the same.

The characteristic features of the solution according to the invention are described in detail in claim 1, and the characteristic features of its preferred embodiments in the other claims.

The choke arrangement according to the invention is suited best to locations in which an active input bridge is connected in the direction of the supply network, e.g. PWM frequency converters provided with a so-called AFE bridge. The same type of choke can of course also be used on the output side of the frequency converter to attenuate the harmonics and common-mode currents supplied to the motor circuit. The arrangement is especially suited for filtering the switching frequency harmonics characteristic to a PWM frequency converter and for reducing the steepness of the rising edges and falling edges of voltage pulses (du/dt filtering).

SHORT DESCRIPTION OF THE DRAWINGS

Figure 1:
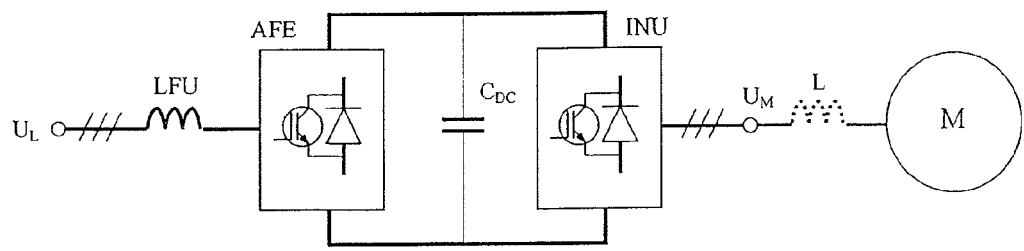
Figure 2:
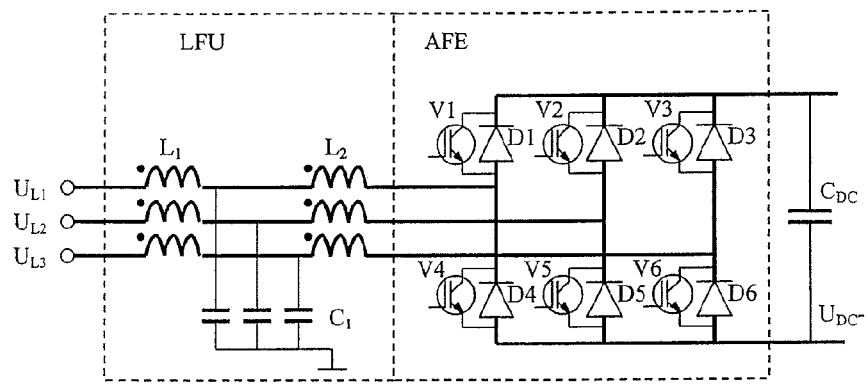
Figure 4A:
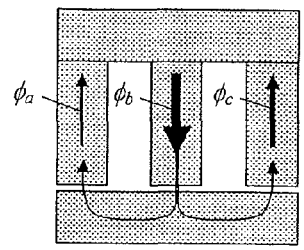
Figure 4B:
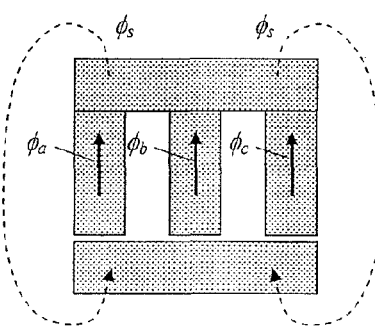
Figure 5:
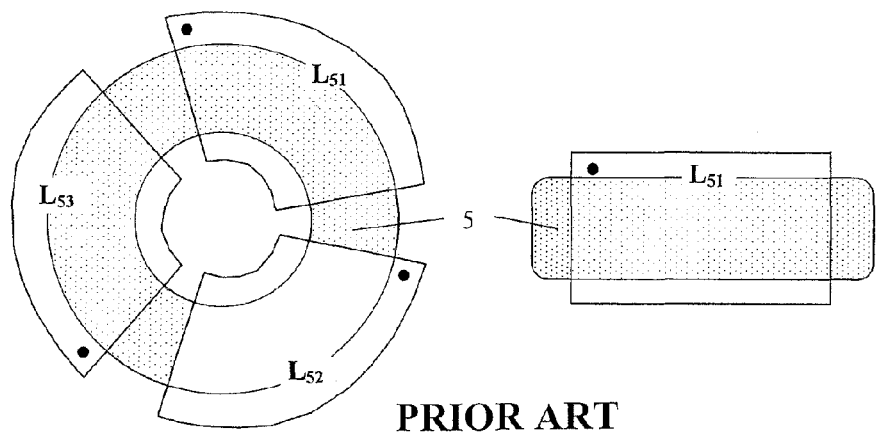
Figure 6:
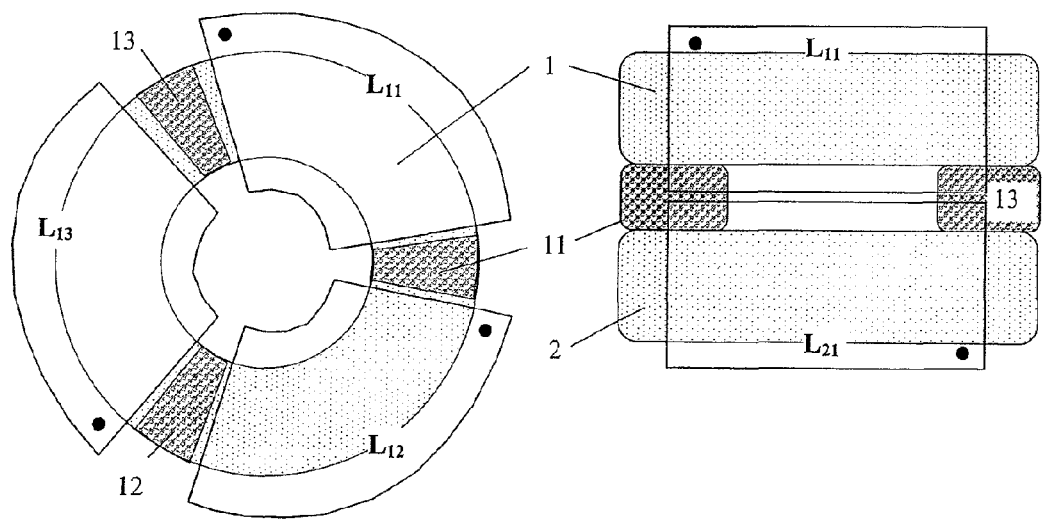
Figures 7A, 7B:
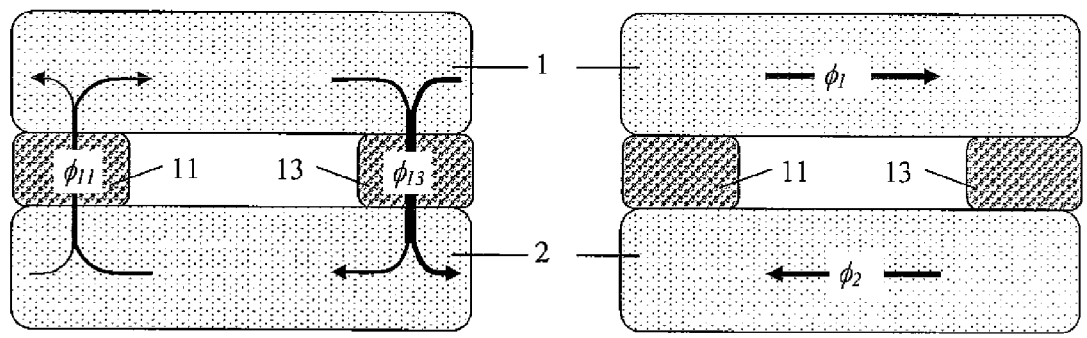
Figure 8:
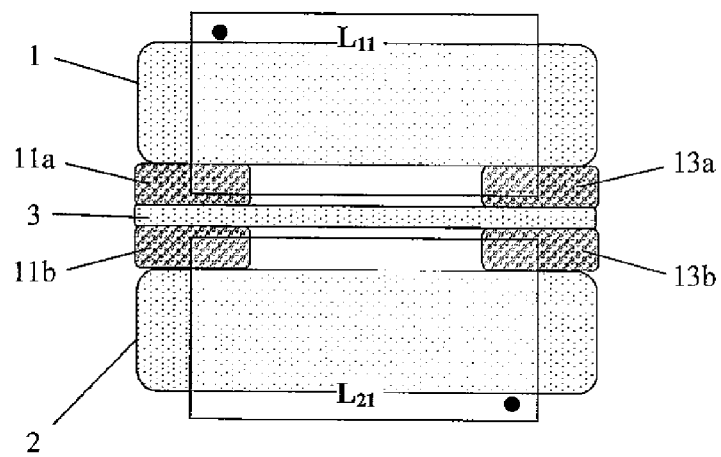
Figure 9:
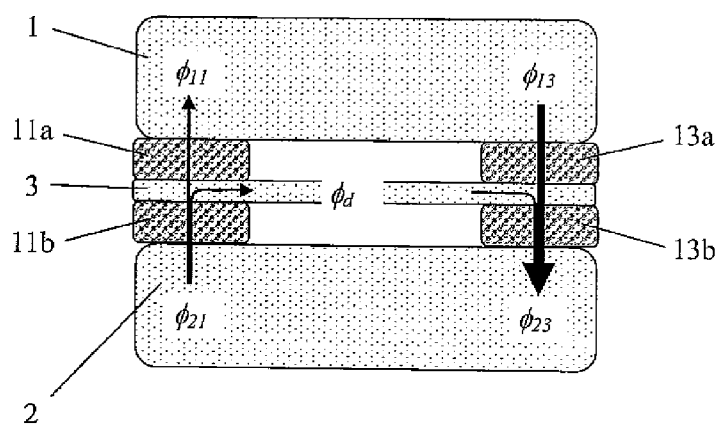
Figure 10A:
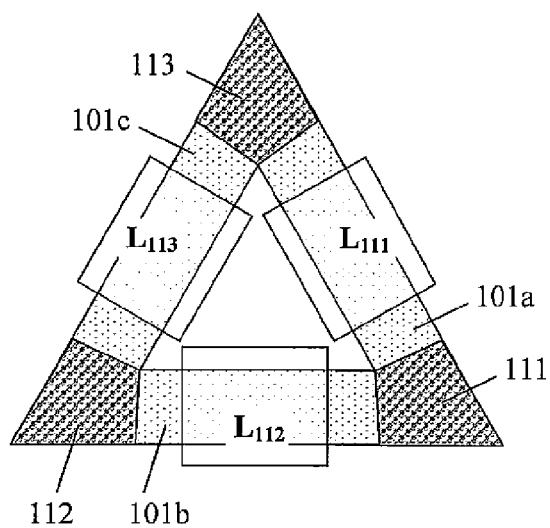
Figure 10B:
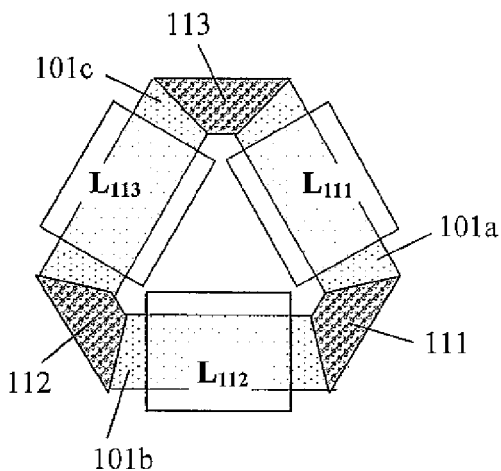

In the following, the invention will be described in more detail by the aid of some embodiments with reference to the attached drawings, wherein FIG. 1 presents the main circuit of a frequency converter FIG. 2 presents an active input bridge, with its filters, of a PWM frequency converter provided with an active network bridge, FIG. 3 presents a prior-art three-phase choke solution, FIGS. 4a and 4b present the pathways of magnetic flux with a difference-mode current and a common-mode current in a choke solution according to FIG. 3, FIG. 5 presents a prior-art three-phase toroidal choke solution for attenuating common-mode currents, FIG. 6 presents a three-phase choke solution according to the invention, FIGS. 7a and 7b present the pathways of magnetic flux with a difference-mode current and a common-mode current in a choke solution according to FIG. 6, FIG. 8 presents another three-phase choke solution according to the invention, FIG. 9 presents the pathways of the flux components produced by difference-mode currents of different magnitudes in the choke solution according to FIG. 8, FIGS. 10a and 10b present alternative three-phase choke solutions according to the invention.

Figure 11:
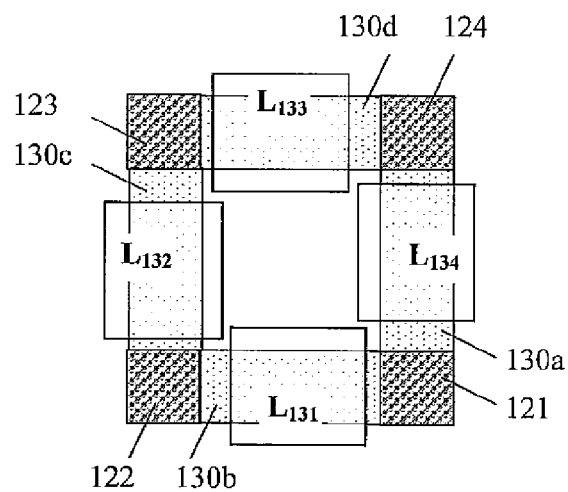

FIG. 11 presents a four-phase choke solution according to the invention.

DETAILED DESCRIPTION OF THE INVENTION

FIG. 1 contains a view on a block diagram level of a three-phase AC motor drive provided with regenerative braking regulation of the speed of rotation, which motor drive comprises a filter unit LFU, a network bridge AFE with regenerative braking, a filtering capacitor $C_{DC}$ of the DC voltage of the intermediate circuit of the frequency converter, an inverter INU, an output filter L that is necessary in some cases, and also a motor M. This invention relates to the filter unit LFU and more particularly to the choke it comprises. The same kind of choke can be used also as an output filter L, in which it brings advantages in, among other things, the attenuation of common-mode interference.

FIG. 2 presents a more detailed circuit diagram of the blocks LFU and AFE. The LFU unit comprises two three-phase chokes $L_1$ and $L_2$, which are wound e.g. in the direction presented in the figure with a dot marking known in the art. The filter unit LFU normally also comprises phase-specific capacitors $C_1$ connected between the chokes, the other ends of which are connected e.g. to ground potential or to the negative busbar $U_{DC}$- of the DC intermediate circuit of the frequency converter.

The network bridge AFE comprises three phase switches, which connect the frequency converter to the input phases of the positive or the negative ($U_{DC}$-) pole of the filtering capacitor $C_{DC}$ of the DC intermediate circuit according to the known PWM principle in order to form three-phase voltage. The network current is determined as is known from the amplitude difference and the phase difference of the voltage formed from this DC intermediate circuit voltage and the supply network voltage, as well as from the impedance of the filter unit LFU. The AFE phase switches comprise fast power semiconductor switches, e.g. the IGBTs V1 . . . V6 and the fast diodes D1 . . . D6 connected in antiparallel with them.

FIG. 3 presents the construction of a typical conventional three-phase choke. The choke comprises a magnetic core, which comprises three pillars 31a-31c and the yokes 32a, 32b that connect the ends of the pillars. The magnetic circuit also normally comprises an air gap 33a-33c, with which the desired inductance value, and the current limit at which the magnetic core starts to saturate, can be influenced. The phase-specific windings $L_{31}$, $L_{32}$ and $L_{33}$ are wound in the same direction around the pillars. The magnetic core of the choke operating at the frequency of this kind of supply network is usually assembled from die cut plate sections stacked one on top of the other, but nowadays powder materials suited to the purposes are also available.

FIG. 4a presents how the magnetic flux travels in the choke according to FIG. 3 with a difference-mode current. A difference-mode current refers in this context to a normal three-phase current of fundamental frequency, the sum of the phase currents of which is 0. Difference-mode flux travels in the pillars and yokes counter to the phase currents such that e.g. $\phi_b = \phi_a + \phi_c$.

FIG. 4b presents the flow of the magnetic flux in the choke according to FIG. 3 with a common-mode current, which is a current component traveling in the same direction and in the same phase in all phases. This kind of current is typically produced owing to stray capacitance caused by the operation of the fast phase switches of the AFE and the INU. The fluxes $\phi_a$-$\phi_c$ produced by the common-mode phase currents travel in the same direction in the pillars, as a result of which they do not have a return path along the core material. The return path in this case is the stray flux $\phi_S$ outside the core described with a dotted line in FIG. 4b. As a result of the return path the ability to attenuate common-mode currents with the choke according to FIG. 3 is poor, and in addition the stray flux can cause a rise in the outwardly visible level of interference radiation.

It is known that the attenuation of common-mode currents is improved by adding an extra pillar into a choke according to FIG. 3 or by using e.g. a three-phase toroidal choke according to FIG. 5. In this kind of choke the phase windings $L_{51}$, $L_{52}$ and $L_{53}$ are disposed symmetrically and wound in the same direction around the core 5, so that only common-mode current produces flux that circulates in the core. It is possible with the selection of the core material and with possible air gaps to influence how great is the inductance that attenuates the common-mode currents of the choke.

FIG. 6 presents a choke solution according to this invention. The choke comprises in the case of this embodiment two toroidal cores 1, 2 one on top of the other and the phase windings $L_{11}$, $L_{12}$, and $L_{13}$ as well as $L_{21}$, $L_{22}$, and $L_{23}$ disposed symmetrically around them ($L_{22}$ and $L_{23}$ are not seen in the figure, but they are disposed correspondingly at the same point of the windings belonging to the same phase as $L_{21}$ in the right-hand part of the figure). According to the dot markings of the right-hand part of the figure, the first phase windings ($L_{11}$, $L_{12}$, $L_{13}$) are wound in the opposite direction to the second phase windings ($L_{21}$, $L_{22}$, $L_{23}$). The choke solution additionally comprises connecting pieces 11-13 disposed symmetrically between the cores, which connecting pieces are also manufactured from magnetic core material and which function as a bridge connecting the magnetic circuits of both the toroidal cores 1, 2.

FIG. 7a presents how the magnetic flux travels in the choke according to the invention with a difference-mode current. The windings belonging to the same phase, e.g. $L_{11}$ and $L_{21}$ according to FIG. 6, magnetize their own toroidal cores 1, 2 in different directions, in which case the magnetic flux produced by them manages to pass easily via the connecting pieces 11 and 13 from one toroidal core to another ($\phi_{11}$, $\phi_{13}$). That being the case the inductance to be exerted on the difference-mode current can be influenced with the selections of the magnetic core materials and with possible air gaps e.g. at the junctions of the toroidal cores and the connecting pieces.

FIG. 7b presents the flow of the magnetic flux in the choke according to the invention with a common-mode current. As a result of the symmetrical windings the fluxes ($\phi_1$, $\phi_2$) now travel purely in their own cores 1, 2, without passing via the connecting pieces 11-13 at all. That being the case the inductance to be exerted on the common-mode current can be influenced simply with the material selections of the toroidal cores and with possible air gaps.

FIG. 8 presents another embodiment of the choke solution according to the invention. The solution is otherwise similar to that presented in FIG. 6, but each connecting piece is here divided into two parts (11a, 11b, 12a, 12b, 13a, 13b), between which is disposed an extra toroidal magnetic core 3. A winding is not disposed around the core 3.

The extra core 3 has importance when the currents of the three-phase chokes ($L_1$ and $L_2$ in FIG. 2) are not of equal magnitude. The difference in magnitude of the currents is a result of the behavior of the filtering capacitors ($C_1$, FIG. 2) connected between the chokes, in which filter solution the normal aim is the AFE switching frequency currents of the network bridge travel for the most part via the filtering circuit $L_2$-$C_1$ to the supply network without passing via the choke $L_1$. In this kind of situation the magnetic fluxes ($\phi_{11}$, $\phi_{13}$ in FIG. 9) passing from the first toroidal core to the connecting piece are of different magnitudes than the magnetic fluxes ($\phi_{21}$, $\phi_{23}$ in FIG. 9) passing from the second toroidal core to the connecting pieces. Owing to the extra core 3 the difference ($\phi_d$ in FIG. 9) of the magnetic fluxes now has its own pathway in which case the inductance attenuating the offset current can be influenced with the materials and possible air gaps of the extra core 3 and of the connecting pieces (11a, 11b, 12a, 12b, 13a, 13b). Owing to the currents of different magnitudes and of different frequencies it can be advantageous to use different core materials in the toroidal cores 1 and 2.

FIGS. 10a and 10b present alternative solutions for magnetic cores according to this invention. The figures present only one of the magnetic cores stacked one on top of the other. In these solutions the magnetic cores comprise different pieces, which are however arranged to form a closed magnetic circuit. The windings L111-L113 (and correspondingly the windings L121-L123 in the other core) are in these cases disposed around the straight core parts 101a-101c (102-102c in the other core), which are arranged into a triangle (FIG. 10a) or into a hexagonal shape (FIG. 10b). The core parts surrounded by the windings are connected with the connecting pieces 111-113 disposed at the tips of the triangle.

FIG. 11 presents a choke solution according to the invention, which comprises four phase windings. Only one of the magnetic cores of the invention, which are placed one on top of the other, is presented in the figure. In this solution the magnetic cores comprise separate pieces, which are however arranged to form a closed magnetic circuit. The windings L131-L134 (and correspondingly the windings L141-L144 in the other core) are in these cases disposed around the straight core pieces 130a-130d (140a-140d in the other core), which are arranged into a square shape. The core pieces surrounded by the windings are connected with the connecting pieces 121-124 disposed at the corners of the rectangle. The four-phase choke solution can, of course, also be implemented using toroidal magnetic cores.

This type of four-phase solution can be used in a filter unit of output voltage e.g. when a network independent of the public distribution network (so-called isolated operation) is supplied with a frequency converter or with an inverter unit, and when the loading of this type of network is allowed to be asymmetrical or even single-phase. In this kind of case the neutral wire of the network is connected to travel via the fourth phase of the choke, in which case also the neutral current is effectively filtered.

It is most natural when using toroidal core parts to use powder material or ferrite material, but it is also possible to use parts manufactured from die cut plate sections, e.g. in the solutions according to FIG. 10. The windings in solutions according to FIGS. 10 and 11 can be disposed around separate coil formers, which are then installed around the core parts as prefabricated windings. When the cores are toroidal the windings can be manufactured e.g. from toroidal transformers and toroidal chokes with technology that has become prior art.

It is obvious to the person skilled in the art that the different embodiments of the invention are not limited solely to the examples described above, but that they may be varied within the scope of the claims presented below.

The invention claimed is:

1. A poly-phase filtering choke arrangement of a power electronics appliance, comprising:
    first and second magnetic cores, arranged one above of the other, each of the cores having a shape which forms a closed magnetic circuit, and each being provided with multiple poly-phase windings capable of filtering harmonics of a network current and common-mode noise currents; and
    multiple connecting pieces formed separately from the cores, the connecting pieces being disposed between the first and second magnetic cores so that the first and second magnetic cores are spaced apart yet are connected to each other with the connecting pieces, wherein the poly-phase windings of the first and second magnetic cores have winding directions which are opposed with respect to each other, so that with a common-mode current, fluxes produced in the first and second magnetic cores have opposed directions, and so that with a difference-mode current, the fluxes circulate via the connecting pieces from the first magnetic core to the second magnetic core, and wherein the poly-phase windings and the connecting pieces are arranged in alternating positions around the first and second magnetic cores, the positions being offset from each other, so that when the poly-phase filtering choke is view in plan viewed, the poly-phase windings and the connecting pieces do not overlap each other.

2. Choke arrangement according to claim 1,
wherein the first and second magnetic cores are toroidal, and the connecting pieces and the windings are positioned at different, non-overlapping positions in a circumferential direction of the cores.

3. Choke arrangement according to claim 1,
wherein the first and second magnetic cores are triangular, and the connecting pieces and the windings are positioned at different, non-overlapping positions around the cores.

4. Choke arrangement according to claim 1,
wherein the first and second magnetic cores are hexagonal, and the connecting pieces and the windings are positioned at different, non-overlapping positions around the cores.

5. Choke arrangement according to claim 1,
wherein the first and second magnetic cores are of a rectangular, and the connecting pieces and the windings are positioned at different, non-overlapping positions around the cores.

6. Choke arrangement according to claim 1,
wherein between each of the poly-phase windings is a connection point for connecting a phase-specific capacitor.

7. Choke arrangement according to claim 1,
wherein the connecting pieces are divided into two parts, and a third magnetic core arranged on a plane in the same direction as the first and second magnetic cores, and is fitted between the first and second magnetic cores, wherein the third magnetic core is arranged without a winding, and is shaped to form another closed magnetic circuit.

8. Choke arrangement according to claim 7,
wherein the third magnetic core is of the same shape as the first and second magnetic cores.

9. Choke arrangement according to claim 1,
the first and second magnetic cores of the arrangement are of powder material or of ferrite material.

10. Choke arrangement according to claim 1,
wherein the magnetic cores of the arrangement are formed from die cut core parts that are stacked one on top of the other.

11. Choke arrangement according to claim 1,
wherein the magnetic cores of the arrangement comprise different pieces, which are connected to each other.

12. Choke arrangement according to claim 1,
wherein the first magnetic core of the arrangement is of a different material than that of the second magnetic core.

13. Choke arrangement according to claim 1,
wherein the material of the connecting pieces is the same as a material of one of the first and second magnetic cores.

14. Choke arrangement according to claim 1,
wherein the connecting pieces are of a different material than that of the first and second magnetic cores.

15. Choke arrangement according to claim 1,
wherein subassemblies comprising each of the first and second magnetic cores are essentially the same.

16. Choke arrangement according to claim 1,
wherein a fourth winding and another connecting piece are arranged in the choke between the first and second magnetic cores.

17. Choke arrangement according to claim 1,
wherein the multiple poly-phase windings include three poly-phase windings each of which extends in a circumferential direction of the cores by an extent that is greater than an extent of the spaces between adjacent ones of the poly-phase windings.

18. Choke arrangement according to claim 3,
wherein between each of the poly-phase windings is a connection point for connecting a phase-specific capacitor.

19. Choke arrangement according to claim 4,
wherein between each of the poly-phase windings is a connection point for connecting a phase-specific capacitor.

20. Choke arrangement according to claim 5,
wherein between each of the three phase poly-phase windings is a connection point for connecting a phase-specific capacitor.

* * * * *